United States Patent
Chen et al.

(10) Patent No.: US 11,658,675 B2
(45) Date of Patent: May 23, 2023

(54) SUCCESSIVE-APPROXIMATION REGISTER ANALOG-TO-DIGITAL CONVERTER, CORRECTION METHOD AND CORRECTION SYSTEM

(71) Applicant: Chung Yuan Christian University, Taoyuan (TW)

(72) Inventors: Shih-Lun Chen, Taoyuan (TW); Chun Kuan Wu, Taoyuan (TW); Chun Yu Lin, Taoyuan (TW); Wen-Shen Lo, Taoyuan (TW)

(73) Assignee: Chung Yuan Christian University, Taoyuan (TW)

( * ) Notice: Subject to any disclaimer, the term of this patent is extended or adjusted under 35 U.S.C. 154(b) by 40 days.

(21) Appl. No.: 17/533,030

(22) Filed: Nov. 22, 2021

(65) Prior Publication Data

US 2023/0108759 A1 Apr. 6, 2023

(30) Foreign Application Priority Data

Oct. 6, 2021 (TW) .................. 110137196

(51) Int. Cl.
*H03M 1/40* (2006.01)
*H03M 1/10* (2006.01)

(52) U.S. Cl.
CPC ......... *H03M 1/403* (2013.01); *H03M 1/1023* (2013.01)

(58) Field of Classification Search
CPC ............................ H03M 1/403; H03M 1/1023
USPC .................................................. 341/118, 172
See application file for complete search history.

(56) References Cited

U.S. PATENT DOCUMENTS

| | | | |
|---|---|---|---|
| 4,975,700 A | 12/1990 | Tan et al. | |
| 7,786,908 B2 * | 8/2010 | Yoshinaga | H03M 1/1023 341/172 |
| 10,790,842 B1 * | 9/2020 | Paussa | H03M 1/069 |
| 2011/0260899 A1 | 10/2011 | Snedeker | |

FOREIGN PATENT DOCUMENTS

| | | |
|---|---|---|
| TW | 201322641 | 6/2013 |
| TW | 202127804 | 7/2021 |

OTHER PUBLICATIONS

"Office Action of Taiwan Counterpart Application", dated Jan. 14, 2022, p. 1-p. 5.

* cited by examiner

*Primary Examiner* — Khai M Nguyen
(74) *Attorney, Agent, or Firm* — JCIPRNET

(57) ABSTRACT

A successive-approximation register analog-to-digital converter (SAR ADC), a correction method and a correction system are provided. The SAR ADC generates an original weight value sequence according to multiple original weight values. The SAR ADC converts an analog time-varying signal to establish a transforming curve corresponding to the original weight values. In addition, the SAR ADC generates an offset value sequence according to an offset of the transforming curve, uses the offset value sequence to correct the original weight value sequence to generate a corrected weight value sequence, and uses multiple corrected weight values of the corrected weight sequence to improve linearity of the transforming curve.

11 Claims, 7 Drawing Sheets

SUCCESSIVE-APPROXIMATION REGISTER ANALOG-TO-DIGITAL CONVERTER, CORRECTION METHOD AND CORRECTION SYSTEM

CROSS-REFERENCE TO RELATED APPLICATION

This application claims the priority benefit of Taiwanese application serial no. 110137196, filed on Oct. 6, 2021. The entirety of the above-mentioned patent application is hereby incorporated by reference herein and made a part of this specification.

BACKGROUND

Technical Field

The disclosure relates to an analog-to-digital converter, a correction method and a correction system for the analog-to-digital converter, and in particular to a successive-approximation register analog-to-digital converter, a correction method and a correction system for the successive-approximation register analog-to-digital converter.

Description of Related Art

A successive-approximation register analog-to-digital converter (SAR ADC) has multiple preset weight values. The SAR ADC includes a capacitor array. Multiple capacitance values of multiple capacitors in the capacitor array and the weight values correspond to different bits, respectively. The SAR ADC converts an analog voltage signal according to the capacitance values and the weight values to generate corresponding digital code values. Taking a 5-bit SAR ADC as an example, the weight values corresponding to different bits are preset as [16, 8, 4, 2, 1] respectively. A capacitance value of a first capacitor corresponding to a most significant bit in the capacitor array will be set to a capacitance value of 16 units. A capacitance value of a second capacitor corresponding to a second bit will be set to a capacitance value of 8 units. A capacitance value of a third capacitor corresponding to a third bit will be set to a capacitance value of 4 units. A capacitance value of a fourth capacitor corresponding to a fourth bit will be set to a capacitance value of 2 units. A capacitance value of a fifth capacitor corresponding to a least significant bit will be set to a capacitance value of 1 unit.

However, if the capacitors of the capacitor array have offset in the manufacturing process, this will cause the capacitance value of at least one of the capacitors to have offset correspondingly. The offset of the capacitance value will not match the capacitance value with the weight values. Therefore, the conversion of the SAR ADC will be distorted.

SUMMARY

The disclosure provides a successive-approximation register analog-to-digital converter, a correction method, and a correction system, capable of preventing distortion in conversion of the SAR ADC.

The successive-approximation register analog-to-digital converter of the disclosure includes a comparator, a capacitor array, a control circuit, and a processor. The capacitor array is coupled to an input terminal of the comparator. The capacitor array includes multiple capacitors corresponding to different bits. The control circuit is coupled to an output terminal of the comparator. The control circuit stores multiple original weight values corresponding to the capacitors. The processor is coupled to the control circuit and the capacitor array. The processor generates an original weight value sequence according to the original weight values. The processor controls the control circuit, the capacitor array, and the comparator to convert an analog time-varying signal to establish a transforming curve corresponding to the original weight values. In addition, the processor generates an offset value sequence according to an offset of the transforming curve, uses the offset value sequence to correct the original weight value sequence to generate a corrected weight value sequence, and provides multiple corrected weight values of the corrected weight sequence to the control circuit.

The correction method of the disclosure is for the successive-approximation register analog-to-digital converter. The correction method includes the following. Multiple original weight values from the successive-approximation register analog-to-digital converter is received, and an original weight value sequence is generated according to the original weight values. The successive-approximation register analog-to-digital converter is controlled to convert an analog time-varying signal to establish a transforming curve corresponding to the original weight values. An offset value sequence is generated according to an offset of the transforming curve. The offset value sequence is used to correct the original weight value sequence to generate a corrected weight value sequence, and multiple corrected weight values of the corrected weight sequence are provided to the successive-approximation register analog-to-digital converter.

The correction system of the disclosure includes a successive-approximation register analog-to-digital converter and a calibration device. The calibration device communicates with the successive-approximation register analog-to-digital converter. The calibration device receives multiple original weight values from the successive-approximation register analog-to-digital converter, and generates an original weight value sequence according to the original weight values. The calibration device controls the successive-approximation register analog-to-digital converter to convert an analog time-varying signal to establish a transforming curve corresponding to the original weight values. In addition, the calibration device generates an offset value sequence according to an offset of the transforming curve, uses the offset value sequence to correct the original weight value sequence to generate a corrected weight value sequence, and provides multiple corrected weight values of the corrected weight sequence to the successive-approximation register analog-to-digital converter.

Based on the above, the disclosure generates an offset value sequence according to the offset of the transforming curve corresponding to the original weight values, and uses the offset value sequence to correct the original weight value sequence to generate the corrected weight value sequence. Therefore, the corrected weight values of the corrected weight value sequence may be matched with multiple capacitance values of the capacitors of the capacitor array. In this way, the disclosure may effectively prevent the distortion in the conversion of the SAR ADC.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Some embodiments of the disclosure will be described in detail with the accompanying drawings. Regarding the numeral references described in the following descriptions, when the same numeral reference appears in different drawings, they will be regarded as the same or similar components. The embodiments are only a part of the disclosure, and not all implementation methods of the disclosure are disclosed. More precisely, the embodiments are only examples of claims of the disclosure.

Figure 1:
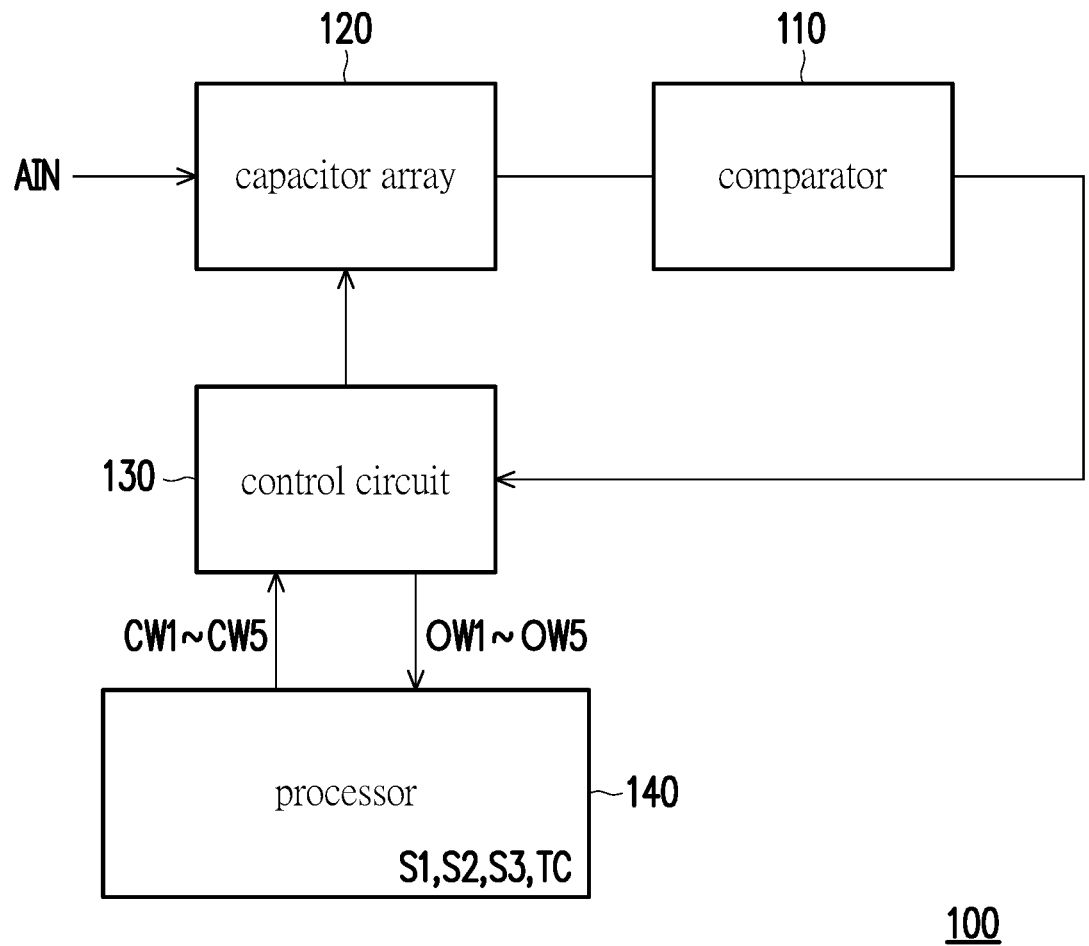
FIG. 1 is a schematic diagram of a successive-approximation register analog-to-digital converter according to an embodiment of the disclosure.

Referring to FIG. 1, FIG. 1 is a schematic diagram of a successive-approximation register analog-to-digital converter according to an embodiment of the disclosure. According to this embodiment, a successive-approximation register analog-to-digital converter (SAR ADC) 100 includes a comparator 110, a capacitor array 120, a control circuit 130, and a processor 140. The capacitor array 120 is coupled to an input terminal of the comparator 110. The capacitor array 120 includes multiple capacitors (not shown). The capacitors are designed to correspond to different bits. The control circuit 130 is coupled to an output terminal of the comparator 110. According to this embodiment, the control circuit 130 stores original weight values OW1 to OW5 corresponding to the capacitors. Taking this embodiment as an example, the SAR ADC 100 is in binary format. The SAR ADC 100 has 5 bits. The original weight values OW1 to OW5 correspond to different bits respectively. The original weight values OW1 to OW5 are preset to 16, 8, 4, 2, and 1, respectively. The original weight value OW1 corresponds to a most significant bit. The original weight value OW2 corresponds to a second bit, and so on. A capacitance value of a first capacitor corresponding to the most significant bit in the capacitor array will be set to a capacitance value of 16 units. A capacitance value of a second capacitor will be set to a capacitance value of 8 units, and so on.

According to this embodiment, the processor 140 is coupled to the control circuit 130 and the capacitor array 120. The processor 140 generates an original weight value sequence S1 according to the original weight values OW1 to OW5. The processor 140 enables the control circuit 130, the capacitor array 120, and the comparator 110 to convert an analog time-varying signal AIN to establish a transforming curve TC corresponding to the original weight values OW1 to OW5. The "conversion" may be successive approximation conversion known in this field. The analog time-varying signal AIN may be a ramp signal or a sinusoidal signal with analog format. In addition, the processor 140 generates an offset value sequence S2 according to an offset of the transforming curve TC, uses the offset value sequence S2 to correct the original weight value sequence S1 to generate a corrected weight value sequence S3, and provides corrected weight values CW1 to CW5 of the corrected weight value sequence S3 to the control circuit 130. Therefore, the corrected weight values CW1 to CW5 of the corrected weight value sequence S3 may be matched with multiple capacitance values of the capacitors of the capacitor array 120. After calibration, the transforming curve TC of the SAR ADC 100 may have extremely high linearity. In this way, the SAR ADC 100 may effectively prevent distortion in conversion (e.g., harmonic distortion corresponding to a sinusoidal signal).

It should be noted that this embodiment uses the offset of the transforming curve TC to correct the original weight value sequence S1 to generate the corrected weight value sequence S3. Therefore, the embodiment does not need to change an analog circuit configuration of the SAR ADC 100, but only changes weight values to improve the linearity of the transforming curve TC. Thus, technical means of this embodiment may improve the linearity of the transforming curve TC in a relatively short time.

Figure 2:
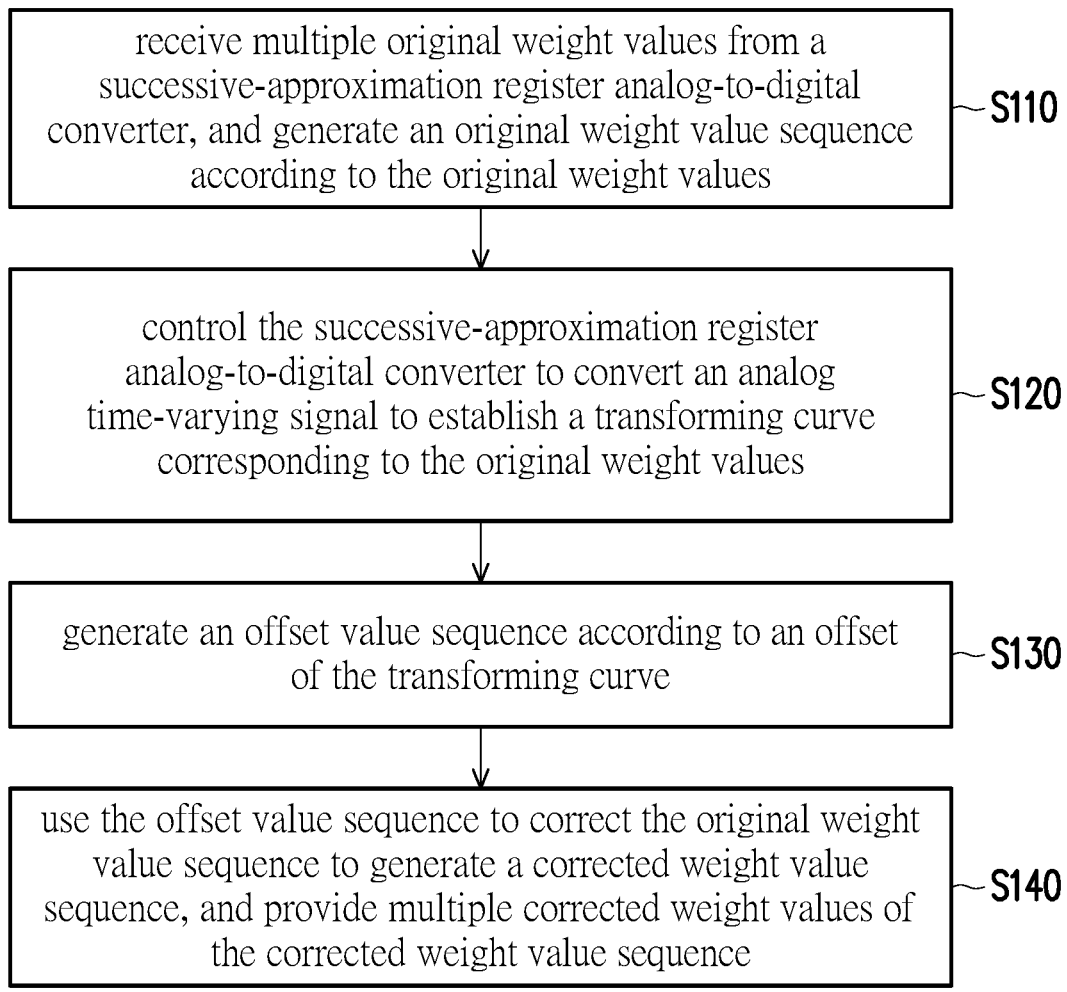
FIG. 2 is a flowchart of a correction method according to an embodiment of the disclosure.

Referring to FIG. 1 and FIG. 2, FIG. 2 is a flowchart of a correction method according to an embodiment of the disclosure. According to this embodiment, the correction method is applied to the SAR ADC 100. In step S110, the processor 140 receives the original weight values OW1 to OW5 from the SAR ADC 100, and generates the original weight value sequence S1 according to the original weight values OW1 to OW5. In step S120, the processor 140 controls the SAR ADC 100 to convert the analog time-varying signal AIN to establish the transforming curve TC corresponding to the original weight values OW1 to OW5. In step S130, the processor 140 generates the offset value sequence S2 according to the offset of the transforming curve TC. In step S140, the processor 140 uses the offset value sequence S2 to correct the original weight value sequence S1 to generate the corrected weight value sequence S3, and provides the corrected weight values CW1 to CW5 in the corrected weight value sequence S3 to the SAR ADC 100.

Figure 3:
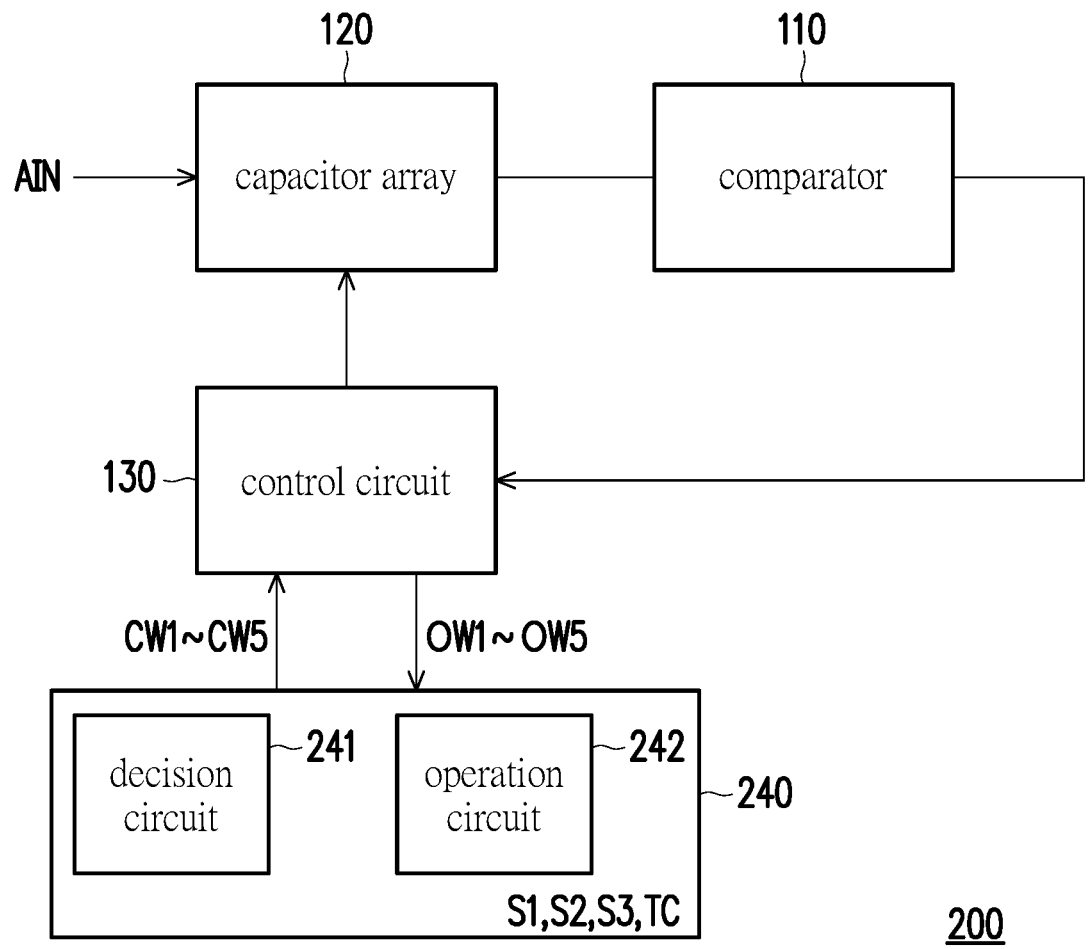
FIG. 3 is a schematic diagram of a successive-approximation register analog-to-digital converter according to another embodiment of the disclosure.
Figure 4:
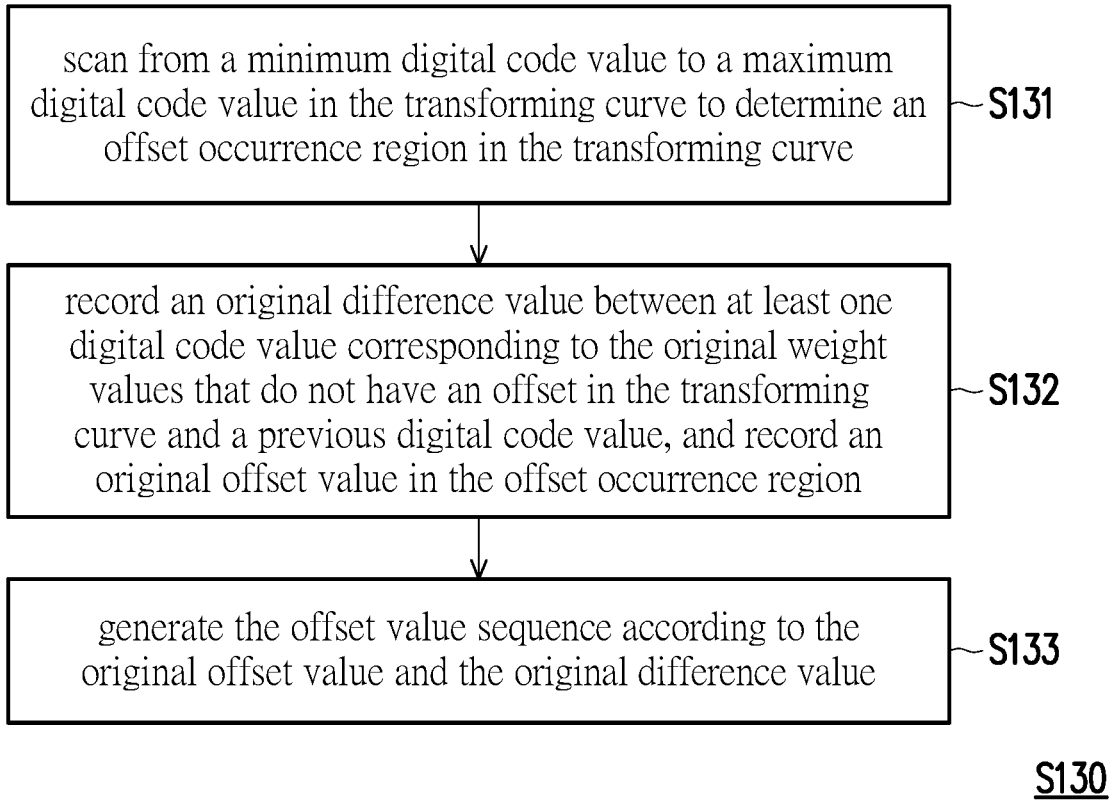
FIG. 4 is a flowchart of a method according to step 130 of FIG. 2.
Figure 5:
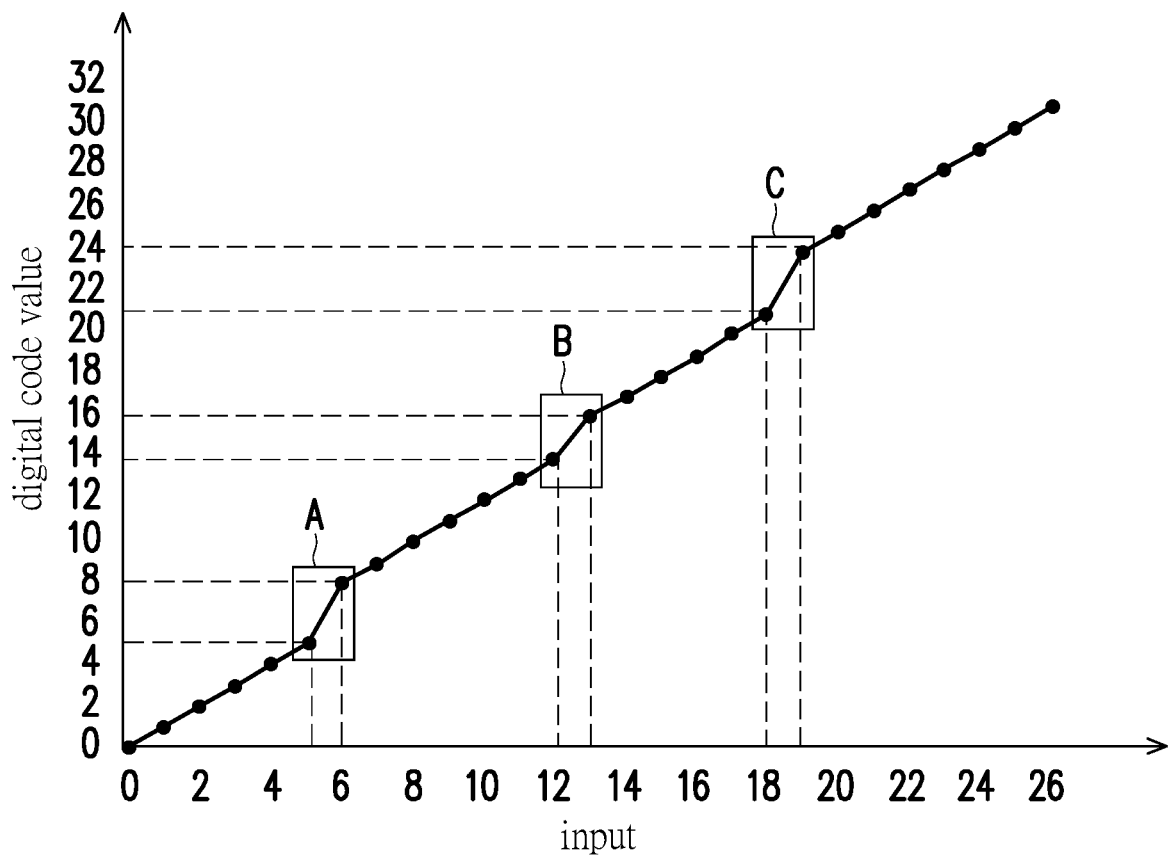
FIG. 5 is a schematic diagram of a transforming curve corresponding to original weight values according to an embodiment of the disclosure.

Further details on the implementation of steps S130 and S140 are described below. Referring to FIG. 3, FIG. 4, and FIG. 5 at the same time, FIG. 3 is a schematic diagram of a successive-approximation register analog-to-digital converter according to another embodiment of the disclosure. FIG. 4 is a flowchart of a method according to step 130 of FIG. 2. FIG. 5 is a schematic diagram of a transforming curve corresponding to original weight values according to an embodiment of the disclosure. According to this embodiment, a SAR ADC 200 includes a comparator 110, a capacitor array 120, a control circuit 130, and a processor 240. The processor 240 includes a decision circuit 241 and an operation circuit 242. Step S130 includes steps S131 to S133. In step S131, the decision circuit 241 scans from a minimum digital code value to a maximum digital code value in the transforming curve TC to determine at least one offset occurrence region in the transforming curve TC. In step S132, the operation circuit 242 records an original difference value between at least one digital code value corresponding to the original weight values OW1 to OW5 that do not have an offset in the transforming curve TC and a previous digital code value. The operation circuit 242 records at least one original offset value in the at least one offset occurrence region. In step S133, the operation circuit 242 further generate the offset value sequence S2 according to the at least one original offset value and the original difference value.

Taking this embodiment as an example, the SAR ADC 200 is in binary format. The SAR ADC 200 has 5 bits. Therefore, the original weight value sequence S1 is [OW1, OW2, OW3, OW4, OW5]. That is, the original weight value sequence S1 is [16, 8, 4, 2, 1]. In step S131, the decision circuit 241 scans from the minimum digital code value (i.e., 1) to the maximum digital code value (i.e., 32) in the transforming curve TC. The decision circuit 241 determines that there are offset occurrence regions A, B, and C in the transforming curve TC. Furthermore, an offset occurrence region A includes two adjacent digital code values 5 and 8. An offset occurrence region B includes two adjacent digital code values 14 and 16. An offset occurrence region C includes two adjacent digital code values 21 and 24. Because the offset occurrence regions A, B and C are greater than the digital code value 4, the original weight values OW3 to OW5 corresponding to the digital code values 4, 2, and 1 are known to be correct by the operation circuit 242. In step S132, the operation circuit 242 records an original difference value between the digital code value 1 corresponding to the original weight value OW5 that does not have an offset and a previous digital code value (i.e., 0), records an original difference value between the digital code value 2 corresponding to the original weight value OW4 that does not have an offset and a previous digital code value (i.e., 1), and records an original difference value between the digital code value 4 corresponding to the original weight value OW3 that does not have an offset and a previous digital code value (i.e., 3). Therefore, original differences corresponding to the original weight values OW3 to OW5 are equal to 1.

In addition, a difference value between the two adjacent digital code values of the offset occurrence regions A, B, and C is greater than 1 respectively. It can be seen that the decision circuit 241 will know the offset occurrence regions A, B, and C according to the difference value between the two adjacent digital code values.

The operation circuit 242 calculates that the difference value between the two adjacent digital code values of the offset occurrence region A is equal to 3, calculates that the difference value between the two adjacent digital code values of the offset occurrence region B is equal to 2, and calculates that the difference value between the two adjacent digital code values of the offset occurrence region C is equal to 3. It should be noted that input values corresponding in the offset occurrence region C are greater than the original weight value OW1. Therefore, the embodiment does not need to consider the offset occurrence region C.

The operation circuit 242 may organize an original offset value sequence according to the original offset value and the original difference value. The original offset value sequence is [GP1, GP2, GP3, GP4, GP5]. GP1 represents an original offset value corresponding to the original weight value OW1 of the most significant bit (i.e., the difference value between the two adjacent digital code values of the offset occurrence region B). GP2 represents an original offset value corresponding to the original weight value OW2 (i.e., the difference value between the two adjacent digital code values of the offset occurrence region C). GP3~GP5 are original difference values corresponding to the original weight values OW3 to OW5 respectively. Therefore, the original offset value sequence is [2, 3, 1, 1, 1].

Next, the operation circuit 242 subtracts the original difference value from the original offset value sequence to generate the offset value sequence S2. Therefore, the offset value sequence S2 is [GP1', GP2', GP3', GP4', GP5']. The offset value GP1' is equal to 1. The offset value GP2' is equal to 2. The offset value GP3' is equal to 0. The offset value GP4' is equal to 0. The offset value GP5' is equal to 0. That is, the offset value sequence S2 is [1, 2, 0, 0, 0].

Figure 6:
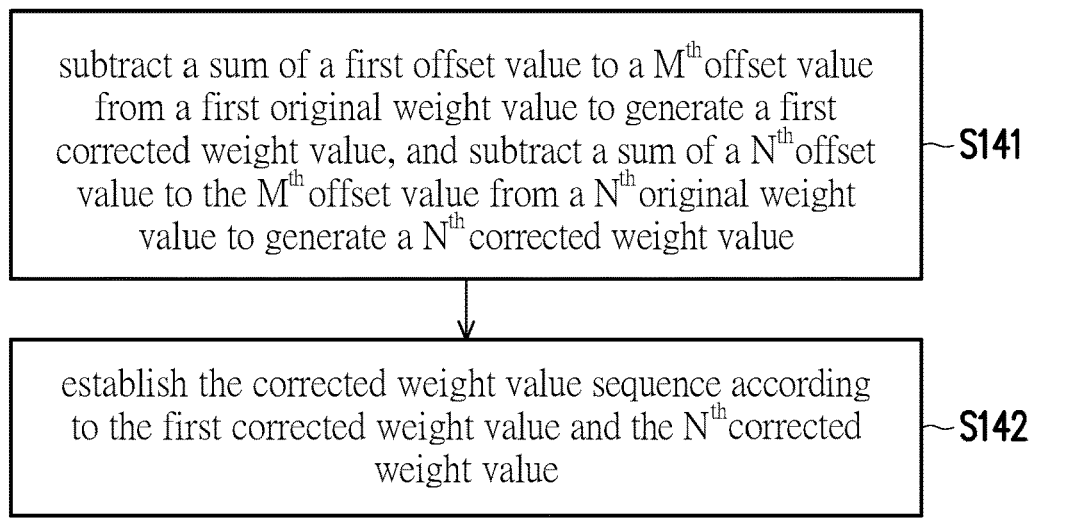
FIG. 6 is a flowchart of a method according to step 140 of FIG. 2.

Next, referring to FIG. 3 and FIG. 6 at the same time, FIG. 3 is a schematic diagram of a successive-approximation register analog-to-digital converter according to another embodiment of the disclosure. FIG. 6 is a flowchart of a method according to step 140 of FIG. 2. According to this embodiment, step S140 includes steps S141 and S142. In step S141, the operation circuit 242 subtracts a sum of a first offset value to a $M^{th}$ offset value from a first original weight value of M original weight values of the original weight value sequence S1 to generate a first corrected weight value. The first original weight value is an original weight value corresponding to the most significant bit. In addition, in step S141, the operation circuit 242 subtracts a sum of a $N^{th}$ offset value to the $M^{th}$ offset value from a $N^{th}$ original weight value to generate a $N^{th}$ corrected weight value. N is a positive integer greater than 1 and less than or equal to M. In step S142, the operation circuit 242 establishes the corrected weight value sequence S3 according to the first corrected weight value and the $N^{th}$ corrected weight value.

Continuing the example, M is equal to 5. N is equal to 2 to 5. The operation circuit 242 subtracts a sum of the offset values GP1' to GP5' from the original weight value OW1 to generate the corrected weight value CW1. The operation circuit 242 subtracts a sum of the offset values GP2' to GP5' from the original weight value OW2 to generate the corrected weight value CW2. The operation circuit 242 subtracts a sum of the offset values GP3' to GP5' from the original weight value OW3 to generate the corrected weight value CW3, and so on. Therefore, the operation circuit 242 calculates the corrected weight values CW1 to CW5 according to formula (1) to formula (5).

$$CW1=OW1-(GP1'+GP2'+GP3'+GP4'+GP5') \quad \text{Formula (1)}$$

$$CW2=OW2-(GP2'+GP3'+GP4'+GP5') \quad \text{Formula (2)}$$

$$CW3=OW3-(GP3'+GP4'+GP5') \quad \text{Formula (3)}$$

$$CW4=OW4-(GP4'+GP5') \quad \text{Formula (4)}$$

$$CW5=OW5-GP5' \quad \text{Formula (5)}$$

According to this example, the original weight value sequence S1 is [16, 8, 4, 2, 1]. The offset value sequence S2 is [1, 2, 0, 0, 0]. Therefore, the corrected weight value CW1=16—(1+2+0+0+0)=13. The corrected weight value CW2=8−(2+0+0+0)=6. The corrected weight value CW3=4−(0+0+0)=4. The corrected weight value CW4=2−(0+0)=2. The corrected weight value CW5=1−(0)=1.

In step S142, the operation circuit 242 establishes the corrected weight value sequence S3 according to the corrected weight values CW1 to CW5. Therefore, the corrected weight value sequence S3 is [13, 6, 4, 2, 1].

Next, the processor 240 provides the corrected weight values CW1 to CW5 of the corrected weight value sequence S3 to the SAR ADC 200.

Figure 7:
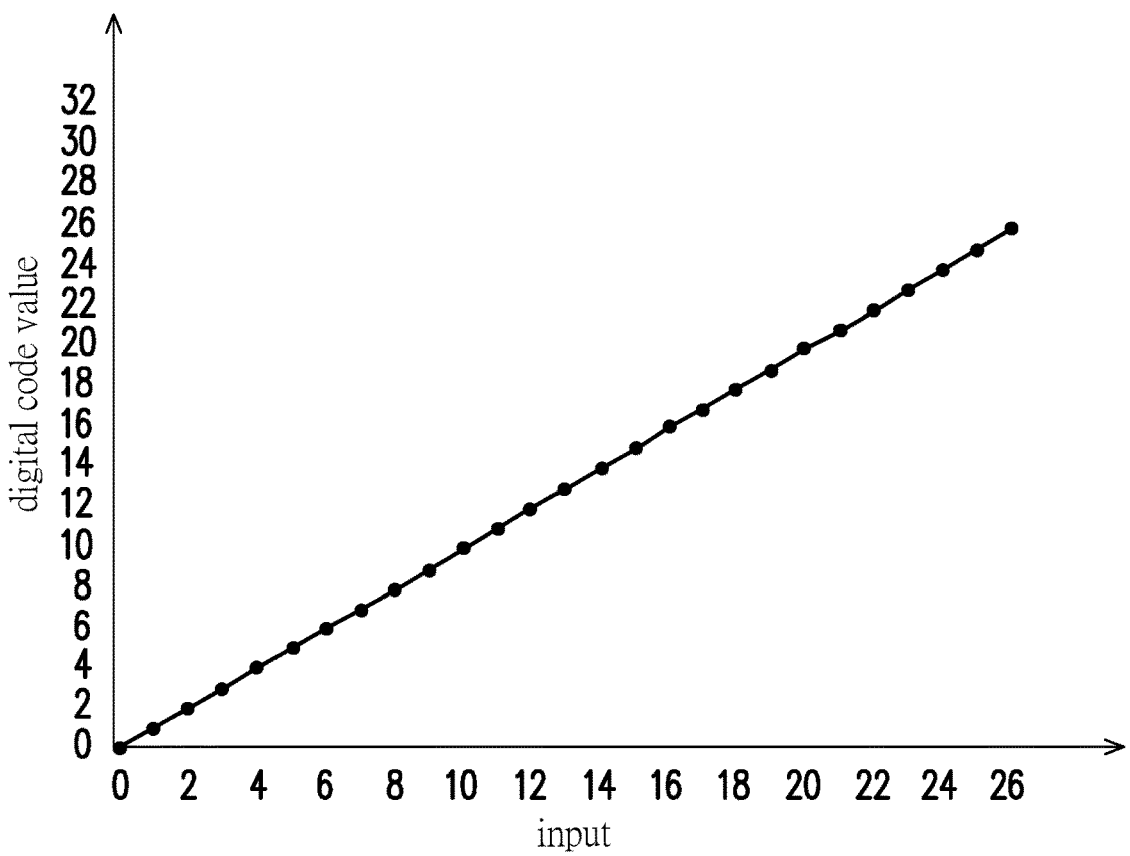
FIG. 7 is a schematic diagram of a transforming curve corresponding to corrected weight values according to an embodiment of the disclosure.

Referring to FIG. 3 and FIG. 7 at the same time, FIG. 7 is a schematic diagram of a transforming curve corresponding to corrected weight values according to an embodiment of the disclosure. The corrected weight values CW1 to CW5 may be matched with the capacitance values of the capacitors of the capacitor array 120. Therefore, after calibration, the transforming curve TC of the SAR ADC 200 may have extremely high linearity.

It should be noted that after calibration, the corrected weight value sequence S3 will not be in binary format. In the corrected weight value sequence S3, the first corrected weight value is less than or equal to a sum of a second corrected weight value to a $M^{th}$ corrected weight value. The second corrected weight value is less than or equal to a sum of a third corrected weight value to the $M^{th}$ corrected weight value. Therefore, based on the corrected weight value sequence S3, the SAR ADC 200 is able to achieve a single digital code value corresponding to a specific input value by various combinations of the corrected weight values in the corrected weight value sequence S3. That is to say, calibration mechanism of the disclosure may make the transforming curve TC with extremely high linearity regardless of capacitance value setting of the capacitor array 120.

Figure 8:
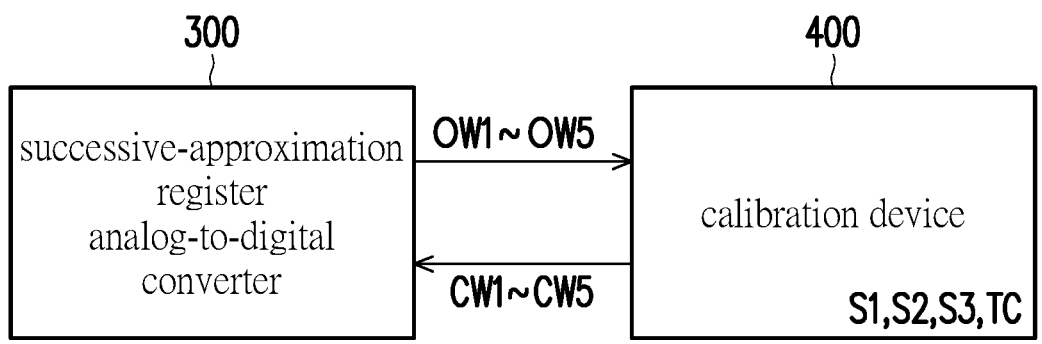
FIG. 8 is a schematic diagram of a correction system according to an embodiment of the disclosure.

Referring to FIG. 8, FIG. 8 is a schematic diagram of a correction system according to an embodiment of the disclosure. According to this embodiment, the correction system includes a SAR ADC 300 and a calibration device 400. The SAR ADC 300 may be a successive-approximation register analog-to-digital converter of any type. The calibration device 400 may be a desktop computer, a notebook computer, a server, a tablet computer and other electronic devices with computing functions. The calibration device 400 communicates wired or wirelessly with the SAR ADC 300. The calibration device 400 receives the original weight values OW1 to OW5 from the SAR ADC 300, and generates the original weight value sequence S1 according to the original weight values OW1 to OW5. The calibration device 400 provides the analog time-varying signal AIN to the SAR ADC 300, and enables the SAR ADC 300 to convert the analog time-varying signal AIN to establish the transforming curve TC corresponding to the original weight values OW1 to OW5. The calibration device 400 generates the offset value sequence S2 according to the offset of the transforming curve TC. The calibration device 400 uses the offset value sequence S2 to correct the original weight value sequence S1 to generate the corrected weight value sequence S3, and provides the corrected weight values CW1 to CW5 of the corrected weight value sequence S3 to the SAR ADC 300. According to this embodiment, operation of the calibration device 400 may be implemented generally by a calibration method shown in FIG. 2 and/or the steps shown in FIG. 4 and FIG. 6, and is therefore not repeated here.

According to some embodiments, the calibration system includes multiple SAR ADCs and the calibration device 400. In other words, the calibration device 400 is capable of calibrating original weight values of the SAR ADCs.

In summary, the disclosure uses the offset of the transforming curve to correct the original weight value sequence to generate the corrected weight value sequence. Therefore, the disclosure does not need to change the analog circuit configuration of the SAR ADC, but only changes the weight values to improve the linearity of the transforming curve. Thus, the technical means of the disclosure may improve the linearity of the transforming curve in a relatively short time. In addition, the calibration mechanism of the disclosure may make the transforming curve TC with extremely high linearity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A successive-approximation register analog-to-digital converter comprising:
    a comparator;
    a capacitor array coupled to an input terminal of the comparator, and comprising a plurality of capacitors corresponding to different bits;
    a control circuit coupled to an output terminal of the comparator, and configured to store a plurality of original weight values corresponding to the capacitors; and
    a processor coupled to the control circuit and the capacitor array, and configured to:
        generate an original weight value sequence according to the original weight values,
        control the control circuit, the capacitor array, and the comparator to convert an analog time-varying signal to establish a transforming curve corresponding to the original weight values,
        generate an offset value sequence according to an offset of the transforming curve, and
        use the offset value sequence to correct the original weight value sequence to generate a corrected weight value sequence, and provide a plurality of corrected weight values of the corrected weight value sequence to the control circuit.

2. The successive-approximation register analog-to-digital converter according to claim 1, wherein the processor comprises:
    a decision circuit configured to scan from a minimum digital code value to a maximum digital code value in the transforming curve to determine at least one offset occurrence region in the transforming curve; and
    an operation circuit configured to record an original difference value between at least one digital code value corresponding to the original weight values that do not have an offset in the transforming curve and a previous digital code value, record at least one original offset value in the at least one offset occurrence region, and generate the offset value sequence according to the at least one original offset value and the original difference value.

3. The successive-approximation register analog-to-digital converter according to claim 2, wherein:
    the at least one original offset value is respectively a difference value between two adjacent digital code values of the at least one offset occurrence region, and
    the difference value between the two adjacent digital code values of the at least one offset occurrence region is greater than 1.

4. The successive-approximation register analog-to-digital converter according to claim 2, wherein the operation circuit organizes an original offset value sequence according to the at least one original offset value and the original difference value, and subtracts the original difference value from the original offset value sequence to generate the offset value sequence.

5. The successive-approximation register analog-to-digital converter according to claim 4, wherein:
    M offset values of the offset value sequence correspond to M original weight values of the original weight value sequence and one bit order, the operation circuit subtracts a sum of a first offset value to a $M^{th}$ offset value from a first original weight value of the M original weight values of the original weight value sequence to generate a first corrected weight value, subtracts a sum of a $N^{th}$ offset value to the $M^{th}$ offset value from a $N^{th}$ original weight value to generate a $N^{th}$ corrected weight value, and establishes the corrected weight value sequence according to the first corrected weight value and the $N^{th}$ corrected weight value, the first original weight value is an original weight value corresponding to a most significant bit, a $M^{th}$ original weight value of the M original weight values of the original weight value sequence is an original weight value corresponding to a least significant bit, and N is a positive integer greater than 1 and less than or equal to M.

6. A correction method for a successive-approximation register analog-to-digital converter, wherein the correction method comprises:

receiving a plurality of original weight values from the successive-approximation register analog-to-digital converter, and generating an original weight value sequence according to the original weight values;

controlling the successive-approximation register analog-to-digital converter to convert an analog time-varying signal to establish a transforming curve corresponding to the original weight values;

generating an offset value sequence according to an offset of the transforming curve; and using the offset value sequence to correct the original weight value sequence to generate a corrected weight value sequence, and providing a plurality of corrected weight values of the corrected weight value sequence to the successive-approximation register analog-to-digital converter.

7. The correction method according to claim 6, wherein generating the offset value sequence according to the offset of the transforming curve comprises:

scanning from a minimum digital code value to a maximum digital code value in the transforming curve to determine at least one offset occurrence region in the transforming curve;

recording an original difference value between at least one digital code value corresponding to the original weight values that do not have an offset in the transforming curve and a previous digital code value, and recording at least one original offset value in the at least one offset occurrence region; and generating the offset value sequence according to the at least one original offset value and the original difference value.

8. The correction method according to claim 7, wherein:
the at least one original offset value is respectively a difference value between two adjacent digital code values of the at least one offset occurrence region, and
the difference value between the two adjacent digital code values of the at least one offset occurrence region is greater than 1.

9. The correction method according to claim 7, wherein generating the offset value sequence according to the at least one original offset value and the original difference value further comprises:

organizing an original offset value sequence according to the at least one original offset value and the original difference value; and subtracting the original difference value from the original offset value sequence to generate the offset value sequence.

10. The correction method according to claim 9, wherein M offset values of the offset value sequence correspond to M original weight values of the original weight value sequence and one bit order, wherein using the offset value sequence to correct the original weight value sequence to generate the corrected weight value sequence further comprises:

subtracting a sum of a first offset value to a $M^{th}$ offset value from a first original weight value of the M original weight values of the original weight value sequence to generate a first corrected weight value, and subtracting a sum of a $N^{th}$ offset value to the $M^{th}$ offset value from a $N^{th}$ original weight value to generate a $N^{th}$ corrected weight value; and establishing the corrected weight value sequence according to the first corrected weight value and the $N^{th}$ corrected weight value, wherein the first original weight value is an original weight value corresponding to a most significant bit, wherein a $M^{th}$ original weight value of the M original weight values of the original weight value sequence is an original weight value corresponding to a least significant bit, and wherein N is a positive integer greater than 1 and less than or equal to M.

11. A correction system comprising:

a successive-approximation register analog-to-digital converter; and a calibration device communicating with the successive-approximation register analog-to-digital converter, and configured to:

receive a plurality of original weight values from the successive-approximation register analog-to-digital converter, and generate an original weight value sequence according to the original weight values, control the successive-approximation register analog-to-digital converter to convert an analog time-varying signal to establish a transforming curve corresponding to the original weight values, generate an offset value sequence according to an offset of the transforming curve, and use the offset value sequence to correct the original weight value sequence to generate a corrected weight value sequence, and provide a plurality of corrected weight values of the corrected weight sequence to the successive-approximation register analog-to-digital converter.

* * * * *